United States Patent
Mahon et al.

(10) Patent No.: US 10,790,787 B2
(45) Date of Patent: Sep. 29, 2020

(54) FET OPERATIONAL TEMPERATURE DETERMINATION BY GATE STRUCTURE RESISTANCE THERMOMETRY

(71) Applicant: MACOM Technology Solutions Holdings, Inc., Lowell, MA (US)

(72) Inventors: Simon John Mahon, Avalon Beach (AU); Allen W. Hanson, Cary, NC (US); Chuanxin Lian, Westford, MA (US); Frank Gao, North Chelmsford, MA (US); Rajesh Baskaran, Dracut, MA (US); Bryan Schwitter, Marrickville (AU)

(73) Assignee: MACOM TECHNOLOGY SOLUTIONS HOLDINGS, INC., Lowell, MA (US)

(*) Notice: Subject to any disclaimer, the term of this patent is extended or adjusted under 35 U.S.C. 154(b) by 0 days.

(21) Appl. No.: 16/537,862

(22) Filed: Aug. 12, 2019

(65) Prior Publication Data

US 2020/0144970 A1     May 7, 2020

Related U.S. Application Data

(63) Continuation of application No. 16/212,585, filed on Dec. 6, 2018, now abandoned, which is a continuation
(Continued)

(51) Int. Cl.
*H01L 23/52*     (2006.01)
*H03F 1/30*     (2006.01)
(Continued)

(52) U.S. Cl.
CPC ............. *H03F 1/301* (2013.01); *G01K 7/16* (2013.01); *G01K 7/18* (2013.01); *H01L 23/535* (2013.01);
(Continued)

(58) Field of Classification Search
CPC . H01L 29/778; H01L 23/535; H01L 27/0738; H01L 28/20; H01L 29/402; H01L 29/404
See application file for complete search history.

(56) References Cited

U.S. PATENT DOCUMENTS

| | | | |
|---|---|---|---|
| 3,906,310 A | 9/1975 | Esashika | |
| 4,078,247 A | 7/1978 | Albrecht | |

(Continued)

FOREIGN PATENT DOCUMENTS

| | | |
|---|---|---|
| CN | 1106572 A | 8/1995 |
| CN | 105518865 A | 4/2016 |

(Continued)

OTHER PUBLICATIONS

U.S. Appl. No. 16/439,422, filed Jun. 12, 2019, Kelly.
(Continued)

*Primary Examiner* — Nicholas J Tobergte
(74) *Attorney, Agent, or Firm* — Thomas | Horstemeyer, LLP; Jason M. Perilla

(57) ABSTRACT

Thermally-sensitive structures and methods for sensing the temperature in a region of a FET during device operation are described. The region may be at or near a region of highest temperature achieved in the FET. Metal resistance thermometry (MRT) can be implemented with gate or source structures to evaluate the temperature of the FET.

36 Claims, 8 Drawing Sheets

Related U.S. Application Data of application No. 15/658,116, filed on Jul. 24, 2017, now abandoned.

(51) Int. Cl.

| | | |
|---|---|---|
| *H01L 23/535* | (2006.01) | |
| *H01L 29/423* | (2006.01) | |
| *H03F 3/21* | (2006.01) | |
| *H01L 29/40* | (2006.01) | |
| *H01L 29/778* | (2006.01) | |
| *G01K 7/18* | (2006.01) | |
| *G01K 7/16* | (2006.01) | |
| *H01L 29/788* | (2006.01) | |
| *H01L 49/02* | (2006.01) | |
| *H01L 23/34* | (2006.01) | |
| *H01L 29/20* | (2006.01) | |
| *H01L 29/16* | (2006.01) | |
| *H01L 29/78* | (2006.01) | |
| *H01L 29/417* | (2006.01) | |

(52) U.S. Cl.
CPC .......... *H01L 29/402* (2013.01); *H01L 29/404* (2013.01); *H01L 29/42316* (2013.01); *H01L 29/42324* (2013.01); *H01L 29/7786* (2013.01); *H01L 29/788* (2013.01); *H03F 3/21* (2013.01); *G01K 2217/00* (2013.01); *H01L 23/34* (2013.01); *H01L 28/20* (2013.01); *H01L 29/16* (2013.01); *H01L 29/20* (2013.01); *H01L 29/2003* (2013.01); *H01L 29/41758* (2013.01); *H01L 29/778* (2013.01); *H01L 29/78* (2013.01); *H01L 29/7816* (2013.01); *H03F 2200/174* (2013.01); *H03F 2200/468* (2013.01); *H03F 2200/471* (2013.01); *H03F 2200/481* (2013.01)

(56) References Cited

U.S. PATENT DOCUMENTS

| | | | |
|---|---|---|---|
| 4,127,885 A | 11/1978 | Adam et al. | |
| 4,442,416 A | 4/1984 | Epsom et al. | |
| 5,061,863 A | 10/1991 | Mori et al. | |
| 5,389,813 A | 2/1995 | Schwob | |
| 5,510,753 A | 4/1996 | French | |
| 5,574,610 A | 11/1996 | Tachick et al. | |
| 5,712,592 A | 1/1998 | Stimson et al. | |
| 5,986,500 A | 11/1999 | Park et al. | |
| 5,994,965 A | 11/1999 | Davis et al. | |
| 6,552,620 B2 | 4/2003 | Gitsevich et al. | |
| 6,560,081 B1 | 5/2003 | Vashchenko et al. | |
| 6,650,173 B1 | 11/2003 | Khouri et al. | |
| 6,778,018 B2 | 8/2004 | Joly et al. | |
| 6,784,837 B2 | 8/2004 | Revankar et al. | |
| 6,774,718 B2 | 10/2004 | Ichitsubo et al. | |
| 6,950,636 B2 | 9/2005 | Rozenblit et al. | |
| 7,031,127 B1 | 4/2006 | D'Aquino et al. | |
| 7,271,658 B2 | 9/2007 | Matsushita et al. | |
| 7,268,621 B2 | 11/2007 | Kanoh et al. | |
| 7,352,237 B2 | 1/2008 | Snelgrove et al. | |
| 7,328,041 B2 | 5/2008 | Tasaka | |
| 7,471,493 B1 | 12/2008 | Huang et al. | |
| 7,586,720 B1 | 8/2009 | Ozard | |
| 7,593,204 B1 | 9/2009 | Iversen et al. | |
| 7,876,156 B2 | 1/2011 | Tanaka et al. | |
| 7,937,049 B2 | 3/2011 | Phillips et al. | |
| 7,994,862 B1 | 8/2011 | Pukhovski | |
| 8,334,722 B2 | 12/2012 | Sorrells et al. | |
| 8,344,806 B1 | 1/2013 | Franck et al. | |
| 8,477,832 B2 | 2/2013 | Sawatzky | |
| 8,493,160 B2 | 7/2013 | Nicole et al. | |
| 8,710,615 B2 | 4/2014 | Schmidt | |
| 8,624,678 B2 | 7/2014 | Scott et al. | |
| 8,774,737 B2 | 7/2014 | Mori et al. | |
| 8,841,971 B1 | 9/2014 | Geis et al. | |
| 8,847,688 B1 | 9/2014 | Mossawir | |
| 8,890,211 B1 | 11/2014 | Mayo et al. | |
| 9,070,506 B2 | 6/2015 | Anderson et al. | |
| 9,184,284 B2 | 10/2015 | Zundel et al. | |
| 9,197,194 B2 | 11/2015 | Reedy et al. | |
| 9,722,551 B1 | 1/2017 | McKinley et al. | |
| 9,608,102 B2* | 3/2017 | Johnson ............. | H01L 29/2003 |
| 9,768,766 B2 | 9/2017 | Willkofer et al. | |
| 9,911,817 B2* | 3/2018 | Xia ....................... | H01L 29/404 |
| 9,978,858 B2* | 5/2018 | Johnson ............. | H01L 29/2003 |
| 10,132,696 B2 | 11/2018 | Kiep et al. | |
| 2003/0095608 A1 | 5/2003 | Duperray | |
| 2005/0035762 A1 | 2/2005 | Albrecht et al. | |
| 2006/0256489 A1 | 11/2006 | Ker et al. | |
| 2007/0085754 A1 | 4/2007 | Ella et al. | |
| 2007/0264774 A1* | 11/2007 | Luo ...................... | H01L 27/115 438/257 |
| 2009/0072315 A1 | 3/2009 | Hodel et al. | |
| 2009/0262034 A1 | 10/2009 | Satoh | |
| 2010/0026387 A1 | 4/2010 | Blednov | |
| 2012/0055230 A1 | 3/2012 | Naruse et al. | |
| 2012/0153349 A1 | 6/2012 | Suzuki | |
| 2013/0049763 A1 | 2/2013 | Jiang et al. | |
| 2013/0099733 A1 | 4/2013 | Park et al. | |
| 2014/0118074 A1 | 5/2014 | Levesque et al. | |
| 2014/0197891 A1 | 7/2014 | Mooney et al. | |
| 2014/0266432 A1 | 9/2014 | Scott et al. | |
| 2014/0266460 A1 | 9/2014 | Nobbe et al. | |
| 2014/0273888 A1 | 9/2014 | Levinger | |
| 2015/0003490 A1 | 1/2015 | Ash et al. | |
| 2015/0116039 A1 | 4/2015 | Ahmed et al. | |
| 2016/0094187 A1 | 3/2016 | Staudinger et al. | |
| 2016/0211813 A1 | 7/2016 | Gonzalez Jimenez | |
| 2016/0285420 A1 | 9/2016 | Jones | |
| 2017/0018617 A1* | 1/2017 | Xia ....................... | H01L 29/404 |
| 2017/0093353 A1 | 3/2017 | Lautzenhiser | |
| 2017/0104092 A1* | 4/2017 | Tanaka ............. | H01L 29/66462 |
| 2017/0126002 A1 | 5/2017 | Gittemeier | |
| 2017/0294528 A1* | 10/2017 | Ren ..................... | H01L 29/4175 |
| 2017/0131099 A1 | 11/2017 | Aoyama et al. | |
| 2017/0345922 A1* | 11/2017 | Iucolano .......... | H01L 21/02458 |
| 2017/0359033 A1 | 12/2017 | Bazzani et al. | |
| 2017/0359059 A1 | 12/2017 | Bazzani et al. | |
| 2018/0062499 A1 | 3/2018 | Yamamoto et al. | |
| 2018/0109228 A1 | 4/2018 | Kelly | |
| 2018/0158917 A1* | 6/2018 | Odnoblyudov ..... | H01L 29/2003 |
| 2019/0028065 A1 | 1/2019 | Mahon et al. | |
| 2019/0028066 A1 | 1/2019 | Mahon et al. | |
| 2019/0078941 A1 | 3/2019 | Mahon et al. | |

FOREIGN PATENT DOCUMENTS

| | | |
|---|---|---|
| DE | 10 2005 043270 A1 | 3/2007 |
| DE | 10 2007 039951 A1 | 2/2009 |
| EP | 2 565 608 A1 | 3/2013 |
| JP | H03-258008 A | 11/1991 |
| JP | H09-229778 A | 9/1997 |
| WO | WO 2007/035777 A2 | 3/2007 |
| WO | WO 2015/029159 A1 | 3/2015 |

OTHER PUBLICATIONS

U.S. Appl. No. 15/181,841, filed Jun. 14, 2016, Bazzani et al.
U.S. Appl. No. 16/537,831, filed Aug. 12, 2019, Mahon et al.
U.S. Appl. No. 15/704,998, filed Sep. 14, 2017, Mahon et al.
International Search Report and Written Opinion for International Application No. PCT/US2016/046159, dated Nov. 17, 2016.
Written Opinion of the International Preliminary Examining Authority for International Application No. PCT/US2016/046159, dated Oct. 10, 2017.
Ch. II International Preliminary Report on Patentability for International Application No. PCT/US2016/046159, dated Feb. 28, 2018.
International Search Report and Written Opinion for International Application No. PCT/US2017/056285, dated Jan. 3, 2018.

(56) References Cited

OTHER PUBLICATIONS

Written Opinion of the International Preliminary Examining Authority for International Application No. PCT/US2017/056285, dated Sep. 11, 2018.
Ch. II International Preliminary Report on Patentability for International Application No. PCT/US2017/056285, dated Dec. 12, 2018.
International Search Report and Written Opinion for International Application No. PCT/US2017/036717, dated Sep. 18, 2017.
Written Opinion of the International Preliminary Examining Authority for International Application No. PCT/US2017/036717, dated May 24, 2018.
Ch. II International Preliminary Report on Patentability for International Application No. PCT/US2017/036717, dated Sep. 3, 2018.
Invitation to Pay Additional Fees for International Application No. PCT/US2018/042757, dated Oct. 9, 2018.
International Search Report and Written Opinion for International Application No. PCT/US2018/042757, dated Dec. 10, 2018.
International Search Report and Written Opinion for International Application No. PCT/US2018/050859, dated Dec. 11, 2018.
Koyama et al., Implications of Using kW-level GaN Transistors in Radar and Avionic Systems. 2015 IEEE International Conference on Microwaves, Communications, Antennas and Electronic Systems. Nov. 2, 2015. 4 pages.
Kuzmik et al., Determination of channel temperature in AlGaN/GaN HEMTs grown on sapphire and silicon substrates using DC characterization method. IEEE Transactions on Electron Devices. Aug. 2002;49(8):1496-1498.
Schwitter et al., Impact of bias and device structure on gate junction temperature in AlGaN/GaN-on-Si HEMTs. IEEE Transactions on Electron Devices. May 2014;61(5):1327-34.
Schwitter et al., Parameter Extractions for a GaAs pHEMT thermal model using a TFR-heated test structure. IEEE Transactions on Electron Devices. Mar. 2015;62(3):795-801.
Schwitter et al., Study of gate junction temperature in GaAs pHEMTs using gate metal resistance thermometry. IEEE Transactions on Electron Devices. Oct. 2013;60(10):3358-64.
Schwitter et al., Transient gate resistance thermometry demonstrated on GaAs and GaN FET. 2016 IEEE MTT-S International Microwave Symposium (IMS). 2016, 4 pages.
Sheng et al., Coupled microstrip line microwave phase shifter using ferroelectric thin film varactors. J of Applied Physics. Feb. 15, 2012;111(4):44506.
Sun et al., A new ESD protection structure for High-Speed GaAs RF ICs. IEEE Electron Device Letters. Mar. 2005; 26(3): 133-5.

\* cited by examiner

FET OPERATIONAL TEMPERATURE DETERMINATION BY GATE STRUCTURE RESISTANCE THERMOMETRY

CROSS-REFERENCE TO RELATED APPLICATIONS

This Application is a Continuation of U.S. application Ser. No. 16/212,585, filed Dec. 6, 2018, which is a Continuation of U.S. application Ser. No. 15/658,116, filed Jul. 24, 2017. The entire contents of these applications are incorporated herein by reference in their entirety.

BACKGROUND

Technical Field

The technology relates to field-effect transistors having internal temperature-sensing components.

Discussion of the Related Art

Among III-V semiconductor materials, gallium-nitride (GaN) has received appreciable attention in recent years because of its desirable electronic and electro-optical properties. Gallium nitride (GaN) has a wide, direct bandgap of about 3.4 eV, is more resistant to avalanche breakdown, and has a higher intrinsic field strength compared to more common semiconductor materials, such as silicon. In addition, GaN is able to maintain its electrical performance at higher temperatures as compared to other semiconductors, such as silicon or gallium arsenide. GaN also has a higher carrier saturation velocity compared to silicon. Additionally, GaN has a Wurtzite crystal structure, is a hard material, has a high thermal conductivity, and has a much higher melting point than other conventional semiconductors such as silicon, germanium, and gallium arsenide.

Because of its desirable properties, GaN is useful for high-speed, high-voltage, and high-power applications, as well as optoelectronic applications. For example, gallium-nitride materials are useful for active circuit components in semiconductor amplifiers (such as Doherty amplifiers) for radio-frequency (RF) communications, radar, and microwave applications. In high-power applications, GaN transistors may be driven near their performance limits and heat up to temperatures well over 120° C. Excessively high temperatures can lead to premature device degradation and/or failure in GaN transistors and in other semiconductor transistors as well.

SUMMARY

Structures and methods for sensing operational temperatures of transistors are described. Thermally-sensitive structures may be formed in a transistor and used to evaluate an operating temperature of the transistor by sensing changes in resistance of the thermally-sensitive structure, e.g., using metal resistance thermometry (MRT). In some embodiments, a source field plate and/or gate structure of a field-effect transistor (FET) may serve as the thermally-sensitive structure and be modified to apply a probe current, or currents, in a region of the source field plate and/or gate structure. A voltage may develop across the region(s) due to the applied current. The voltage may be monitored to sense temperature changes in a region of the FET that is adjacent to the thermally-sensitive structure(s).

Some embodiments relate to a field-effect transistor (FET) with temperature sensing comprising a gate, a floating gate plate adjacent to the gate and having an extended length, a source contact, a drain contact, and a first pair of contact tabs connected to the floating gate plate and separated by a first distance for applying a probe current through the floating gate plate. The FET may further comprise a second pair of contact tabs connected to the floating gate plate and separated by a second distance for sensing a voltage across a region of the floating gate plate through which the probe current flows.

In some aspects, the floating gate plate overlays at least a portion of the gate. The floating gate plate may exhibit a change in resistance with a change in temperature of the floating gate plate that is not less than 0.001 ohms/° C.

In some cases, the first pair of contact tabs comprises a first thin-film resistor and a second thin-film resistor. A resistance of the first thin-film resistor and of the second thin-film resistor may not be less than 300 ohms. In some implementations, the second pair of contact tabs comprises a third thin-film resistor and a fourth thin-film resistor. A resistance of the third thin-film resistor and of the fourth thin-film resistor may not be less than 300 ohms.

Some implementations of a FET may further comprise a source of the probe current connected to the first pair of contact tabs. The source of the probe current may be configured to provide alternating current. In some cases, the alternating current may have a frequency between 50 kilohertz and 5 megahertz.

According to some aspects, a FET may further comprise voltage-sensing circuitry connected to the second pair of contact tabs. The voltage-sensing circuit may provide an output signal to a feedback circuit that controls a power level of the field-effect transistor.

In some applications, a field-effect transistor may be incorporated in a power amplifier configured to amplify signals to a power level of not less than 0.25 Watt. A FET of the present embodiments may further comprise an active area controlled by the gate, wherein the active area comprises GaN, GaAs, or InP. A FET of the present embodiments may further comprise an active area controlled by the gate, wherein the active area comprises Si. In some implementations, a FET of the present embodiments may be an LDMOS FET, MOSFET, MISFET, or MODFET. In some cases, a FET of the present embodiments may be an HEMT, HFET, or pHEMT.

Some embodiments relate to a method of operating a field-effect transistor that uses a floating gate plate to sense transistor temperature. A method may comprise acts of applying a signal to a gate of the field-effect transistor; amplifying the signal with the field-effect transistor; applying a probe current along a region of a floating gate plate of the field-effect transistor, wherein the floating gate plate overlays at least a portion of the gate; and sensing a voltage produced by the probe current.

In some implementations, a method may further include evaluating from the sensed voltage a peak temperature of the field-effect transistor. The evaluating may comprise using calibration results relevant to the field-effect transistor. A method may also include acts of comparing the sensed voltage to a reference value and controlling a power level of the field-effect transistor based upon the comparison.

In some aspects, applying the probe current may comprise applying the probe current along a region of the floating gate plate that overlays at least a portion of the gate. In some cases, applying the probe current may comprise applying an alternating current to the region. Applying the alternating current may comprise applying the alternating current at a first frequency that is different from a carrier wave frequency of the signal amplified by the field-effect transistor by not less than a factor of 10. In some implementations, applying the probe current may comprise intermittently applying the probe current to the region, such that the probe current is driven for intervals of time that are spaced apart by other intervals of time in which no probe current is driven in the region of the floating gate plate.

Some embodiments relate to a field-effect transistor with temperature sensing comprising a gate metal having an extended length with a first end and an opposing second end, a source contact, a drain contact, a first contact tab connected to the gate metal near the first end for applying an alternating probe current to the gate metal, a capacitor and resistor connected in series between a reference potential and an end region of the gate metal that is remote from the first end, and a pair of contact tabs connected to separated regions of the gate metal for sensing a voltage drop along the gate metal in response to the alternating probe current.

In some implementations, the gate metal may exhibit a change in resistance with a change in temperature of the gate metal that is not less than 0.001 ohms/° C.

Some implementations may further comprise a source of the probe current connected to the first contact tab. The alternating probe current may have a frequency between 50 kilohertz and 5 megahertz.

In some cases, a FET may comprise voltage-sensing circuitry connected to the pair of contact tabs. The voltage-sensing circuit may provide an output signal to a feedback circuit that controls a power level of the field-effect transistor.

According to some aspects, a field-effect transistor of the present embodiments may be incorporated in a power amplifier configured to amplify signals to a power level of not less than 0.25 Watt. An FET of the present embodiments may further comprise an active area controlled by the gate metal, wherein the active area comprises GaN, GaAs, or InP. In some cases, an FET of the present embodiments may further comprise an active area controlled by the gate metal, wherein the active area comprises Si. According to some implementations, the field-effect transistor may be an LDMOS FET, MOSFET, MISFET, or MODFET. In some cases, the field-effect transistor may be an HEMT, HFET, or pHEMT.

Some embodiments relate to a method of operating a field-effect transistor that uses a gate metal for temperature sensing. A method may comprise acts of applying a signal to a gate metal of the field-effect transistor; amplifying the signal with the field-effect transistor; applying an alternating probe current to a first end region of the gate metal of the field-effect transistor, wherein a second end region of the gate metal is remote from the first end region and is terminated by a capacitor and resistor connected in series between a reference potential and the second end region; and sensing a voltage drop produced along a length of the gate metal by the alternating probe current.

According to some aspects, a method may further comprise evaluating from the sensed voltage a peak temperature of the field-effect transistor. A method may also include acts of comparing the sensed voltage to a reference value; and controlling a power level of the field-effect transistor based upon the comparison.

In some cases, applying the alternating probe current may comprise applying the alternating probe current at a first frequency that is different from a carrier wave frequency of the signal by not less than a factor of 10. According to some implementations, applying the alternating probe current may comprise intermittently applying the alternating probe current to the first end region, such that the alternating probe current is driven for intervals of time that are spaced apart by other intervals of time in which no alternating probe current is driven along the length of the gate metal.

Some embodiments relate to a field-effect transistor with temperature sensing comprising a gate metal having an extended length with a first end and a second end, a source, a drain, and a first contact tab connected to a first end region of the gate metal near the first end and configured for applying an alternating probe current to the gate metal, wherein no other contact tab is connected to the gate metal for conducting the probe current and wherein essentially all of the probe current, when applied, couples to a source of the field-effect transistor.

In some implementations, a FET may further comprise a pair of contact tabs connected to separated regions of the gate metal for sensing a voltage drop along the gate metal in response to the alternating probe current. In some cases, voltage-sensing circuitry may be connected to the pair of contact tabs. According to some aspects, the voltage-sensing circuit may provide an output signal to a feedback circuit that controls a power level of the field-effect transistor.

In some cases, the gate metal exhibits a change in resistance with a change in temperature of the gate metal that is not less than 0.001 ohms/° C.

According to some aspects, the alternating probe current may have a frequency between 50 kilohertz and 5 megahertz. In some cases, a FET of the present embodiments may be incorporated in a power amplifier configured to amplify signals to a power level of not less than 0.25 Watt. A FET of the present embodiments may further comprise an active area controlled by the gate metal, wherein the active area comprises GaN, GaAs, or InP. A FET of the present embodiments may further comprise an active area controlled by the gate metal, wherein the active area comprises Si. In some cases, the field-effect transistor may be an LDMOS FET, MOSFET, MISFET, or MODFET. In some aspects, the field-effect transistor may be an HEMT, HFET, or pHEMT.

Some embodiments relate to a method of operating a field-effect transistor that uses a gate metal for temperature sensing. A method may comprise acts of applying a signal to a gate metal of the field-effect transistor; amplifying the signal with the field-effect transistor; applying an alternating probe current to a region of the gate metal of the field-effect transistor, wherein essentially all of the alternating probe current couples to a source of the field-effect transistor; and sensing a voltage drop produced along a length of the gate metal by the alternating probe current.

In some aspects, a method may further comprise evaluating from the sensed voltage a peak temperature of the field-effect transistor. A method may also include acts of comparing the sensed voltage to a reference value; and controlling a power level of the field-effect transistor based upon the comparison.

In some cases, applying the alternating probe current may comprise applying the alternating probe current at a first frequency that is different from a carrier wave frequency of the signal by not less than a factor of 10. According to some implementations, applying the alternating probe current may comprise intermittently applying the alternating probe current to the region, such that the alternating probe current is driven for intervals of time that are spaced apart by other intervals of time in which no alternating probe current is driven in the region of the gate metal.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

High-electron mobility transistors (HEMTs) are a type of semiconductor transistor that utilizes a two-dimensional electron gas (2DEG) for carrier transport. The 2DEG is formed at a heterojunction between two different semiconductor materials having different band gaps. The heterojunction results in the formation of a spatially thin potential well that collects a high-density electrons forming the 2DEG. Typically, the 2DEG forms in an undoped semiconductor. Because of the lack of dopants (which act as impurities) the free electrons can travel through the undoped semiconductor with greatly reduced scattering. Accordingly, HEMTs can be operated at very high frequencies, e.g., well into the terahertz frequency range, and are suitable for radar, microwave, and RF communication applications. HEMTs formed using gallium-nitride or gallium-arsenide materials can also be used for high power applications. In high-power operation, the transistor may heat to high temperatures (e.g., in excess of 120° C.), and it may be desirable to know a highest temperature the transistor attains and/or monitor the temperature of the transistor when placed in service for a particular application.

Figure 1A:
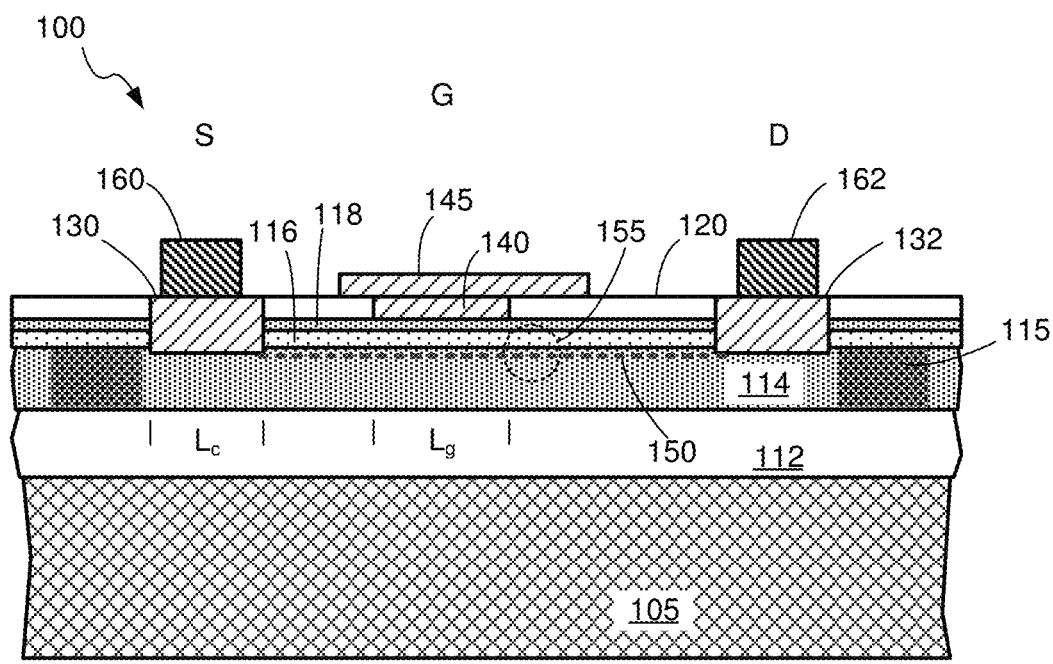
FIG. 1A is an elevation view that depicts structure of a high-electron-mobility transistor (HEMT), according to some embodiments.

An example HEMT structure to which aspects of temperature sensing may be applied is depicted in FIG. 1A, according to some embodiments, though the inventive aspects are not limited to HEMT transistors. A HEMT 100 may be formed as a lateral device, and include a source S, a drain D, and a gate G comprising a gate metal 140. The gate metal 140 may have a length $L_g$ and control the flow of current between the drain D and source S. The gate length $L_g$ may be between approximately 0.1 micron and approximately 3.0 microns, according to some embodiments. The gate, source, and drain may be formed on a same side of a substrate 105 (e.g., on a process surface of the substrate). A lateral HEMT structure has the benefit of not needing through-substrate vias for connecting to a source or drain of the device, which can leave the entire backside of the device available for heat removal. Single-side electrical connections can also make integration of the HEMT into an integrated circuit (IC) an easier task.

In some embodiments, electrical isolation regions 115 may be formed around the source and drain to improve device isolation and reduce leakage currents. The isolation regions 115 may be formed by ion implantation that can damage the crystalline structure, and thereby increase its resistance to leakage current flow.

According to some implementations, a HEMT 100 may comprise a multi-layer structure that includes a substrate 105, a buffer layer 112, a conduction layer 114 in which the 2DEG 150 forms, a barrier layer 116, and at least one electrically-insulating dielectric layer 120. Some embodiments may, or may not, include a semiconductor cap layer 118, which may be formed of a same material as the conduction layer 114. A HEMT may further include a source contact 160 that connects to a source deposition 130 and a drain contact 162 that connects to a drain deposition 132.

In some embodiments, a HEMT 100 may further include at least one gate-connected field plate 145 that is electrically connected to the gate metal 140 and extends beyond edges of the gate metal 140. In some cases, the gate-connected field plate 145 and gate metal 140 may be formed from a same metal that is deposited in a same deposition step (e.g., a T-gate structure). According to some embodiments, the gate metal 140 may be located closer to the source 130 deposition than the drain 132 deposition, though the gate may be centered between the source deposition and drain deposition in some cases, or located nearer the drain in other embodiments. In some implementations, an insulating passivation layer (not shown) may be formed over the gate-connected field plate 145 and source and drain contacts 160, 162.

Figure 1B:
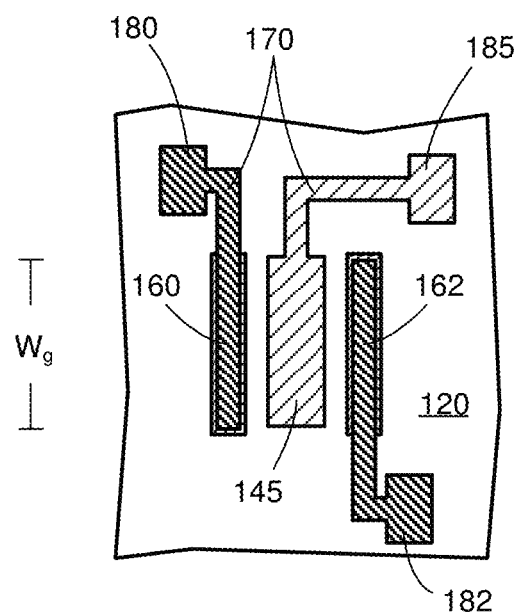
FIG. 1B depicts a plan view of gate, source, and drain structure for a HEMT, according to some embodiments.
Figure 1C:
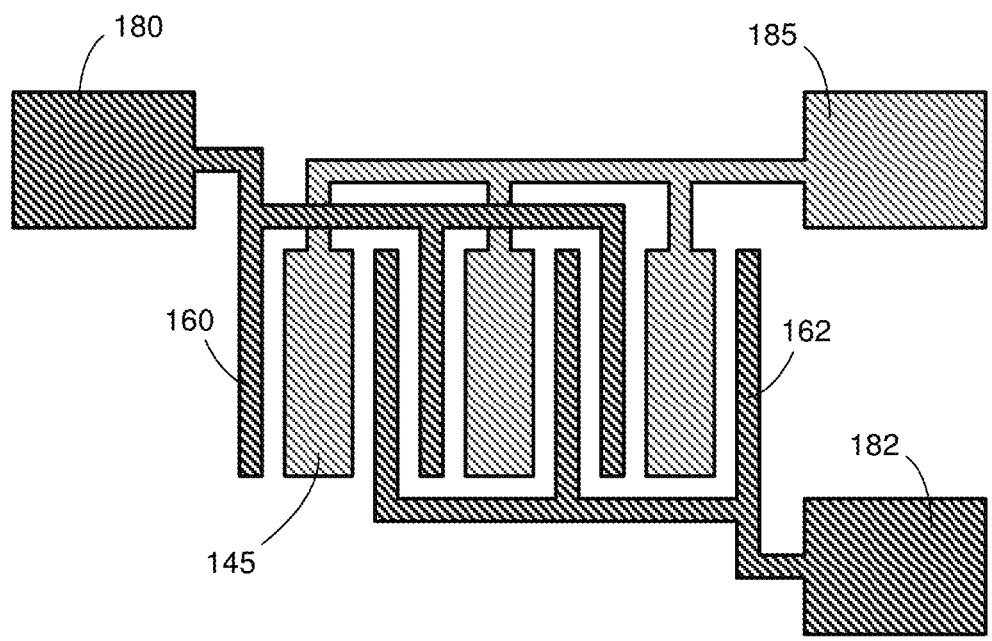
FIG. 1C depicts a plan view of a linear array of HEMT gates, sources, and drains, according to some embodiments.

One or more HEMTs 100 may be arranged on a die to operate together, as depicted in the plan views of FIG. 1B or FIG. 1C. Other configurations are also possible, and there may be multiple transistors connected in a circuit that operate on separate signals. In some implementations, the source, gate, and drain of a transistor may have extended lengths in one direction (e.g., a width direction $W_g$) and run parallel to each other, as depicted in FIG. 1B. In some embodiments, a HEMT may include conductive leads 170 (e.g., interconnects patterned during a metallization level) that extend between a gate or gate-connected field plate 145 and a gate contact pad 185, between a source contact 160 or source field plate (not shown in FIG. 1A-FIG. 1C) and a source contact pad 180, and between a drain contact 162 and a drain contact pad 182. As depicted in FIG. 1C, drain contacts 162 may be shared between two adjacent transistors and source contacts 160 may be shared between two adjacent transistors when the transistors are repeated many times across a substrate in an array, for example. In other configurations, there may be only one of a source contact 160 or drain contact 162 between two adjacent extended gates (sometimes referred to as gate fingers) in an array, and the source and drain contact may alternate along the array, so that each source contact 160 and drain contact 162 in the array is common to two adjacent gates in the array.

Although details of a HEMT are described in connection with various embodiments described herein, the invention is not limited to only HEMT devices. The embodiments may be used on other field-effect transistors such as, but not limited to, junction FETs (JFETs), metal-oxide-semiconductor FETs (MOSFETs), metal-insulator-semiconductor FETs (MISFETs), metal-semiconductor FETs (MESFETs), modulation-doped FETs (MODFETs), heterostructure FETs (HFETs), psuedomorphic HEMTs (pHEMTs), etc. Further, the invention is not limited to gallium-nitride materials. The above types of transistors may have active areas of semiconductor, controlled by the gate, that may be formed using any suitable semiconductor material or materials such as, but not limited to, silicon (Si), germanium (Ge), silicon-carbide (SiC), gallium-arsenide (GaAs), indium-phosphide (InP), cadmium-telluride (CdTe), etc.

As used herein, the phrase "gallium-nitride material" is used to refer to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_xP_yN_{(1-x-y)}$), aluminum indium gallium arsenide phosphoride nitride ($Al_xIn_yGa_{(1-x-y)}As_aP_bN_{(1-a-b)}$), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials in a multi-layer stack may be doped n-type or p-type, or may be undoped. Suitable gallium-nitride materials are described in U.S. Pat. No. 6,649,287, which is incorporated herein by reference in its entirety.

The drawings of HEMTs in FIG. 1A, FIG. 1B, and FIG. 1C are not to scale. The contact pads may be significantly larger than depicted in the drawings and may be significantly larger than the gate, source, and drain contacts, according to some embodiments. In some implementations, an extended gate metal 140 may be significantly narrower than source and/or drain contacts. Although FIG. 1A, FIG. 1B, and FIG. 1C depict one or a few HEMT devices, many devices may be formed on a die or wafer in various embodiments. For example, linear arrays of HEMTs may be fabricated on a semiconductor die to form a power transistor. Because of their small size, there may be hundreds or thousands of HEMTs formed on a die and thousands or millions of HEMTs formed on a wafer. HEMTs or other types of transistors mentioned above may be connected in different types of integrated circuits on a die such as, but not limited to, amplifiers, current sources, signal switches, pulse-generation circuits, power converters, application-specific integrated circuits (ASICs), etc.

In applications such as radar, microwave, and RF communication, amplification or switching of signals at high power levels often occurs. For example, an amplifier may amplify signals to power levels of tens or hundreds of Watts for transmission over long distances. The high power levels can cause heating within the amplifying transistors which, if excessive, can lead to undesirable changes in device performance, premature aging, and/or device failure. The inventors have recognized and appreciated that the heating is non-uniform within a field-effect transistor, and that a hotspot 155 (FIG. 1A) near the drain side of the gate typically occurs. Temperatures in this region can exceed 160° C. during operation of a FET, in some implementations. Such elevated temperatures can accelerate aging of FETs and reduce the mean time to failure (MTTF). Accelerated aging is believed to be due, at least in part, to an increased rate of compound formation at material interfaces within the device. In some cases, prolonged excessive temperatures may lead to sudden device failure (by decreasing the device's resistance to high-voltage breakdown, for example).

To better understand heating in FETs, the inventors have conceived of and implemented structures and methods for monitoring temperature within a FET using metal resistance thermometry (MRT). In some implementations, thermally-sensitive structure near the gate metal 140, and/or the gate metal itself, may be used to monitor FET temperature. In some embodiments, the thermally-sensitive structure may be coupled to the gate metal 140. In other embodiments, the thermally-sensitive structure may connect or couple to the source contact 160. In some cases, sensed temperature values may be used in a feedback paradigm to control operation of a FET, so as to reduce the operating temperature of the FET.

Figure 2A:
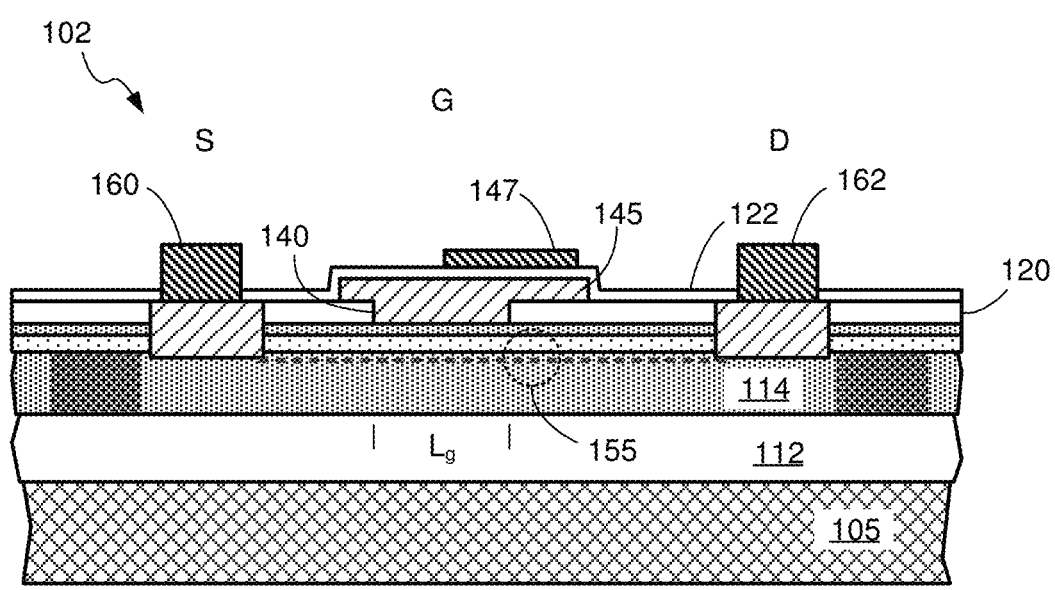
FIG. 2A is an elevation view of a HEMT that includes a floating gate plate, according to some embodiments.

Referring now to the elevation view of FIG. 2A, a HEMT is depicted in which a floating gate plate 147 has been formed adjacent to the gate metal 140 and gate-connected field plate 145. The floating gate plate may serve as a thermally-sensitive structure in the transistor, according to some embodiments. The HEMT may otherwise be similar to the structure described for FIG. 1A. The floating gate plate 147 may be isolated from the gate metal 140 and gate-connected field plate 145 by an insulating layer 122 (e.g., an oxide layer or other dielectric layer). The floating gate plate 147 may extend along and overlay a portion of the gate metal 140, or may overlay all of the gate metal. In some cases, a floating gate plate 147 may be offset from the gate metal 140 toward the drain, and may not overlay the gate metal 140 nor overlay the gate-connected field plate 145. Alternatively, a floating gate plate 147 may overlay a small portion of the gate metal 140 and/or a portion of the gate-connected field plate 145. Offsetting the floating gate plate 147 may reduce capacitive coupling between it and the gate metal and/or gate-connected field plate and reduce an adverse effect on transistor speed.

When using the terms "on," "adjacent," or "over" to describe the locations of layers or structures, there may or may not be one or more layers of material between the described layer and an underlying layer that the layer is described as being on, adjacent to, or over. When a layer is described as being "directly" or "immediately" on, adjacent to, or over another layer, no intervening layer is present. When a layer is described as being "on" or "over" another layer or substrate, it may cover the entire layer or substrate, or a portion of the layer or substrate. The terms "on" and "over" are used for ease of explanation relative to the illustrations, and are not intended as absolute directional references. A device may be manufactured and/or implemented in other orientations than shown in the drawing (for example, rotated about a horizontal axis by more than 90 degrees.

Figure 2B:
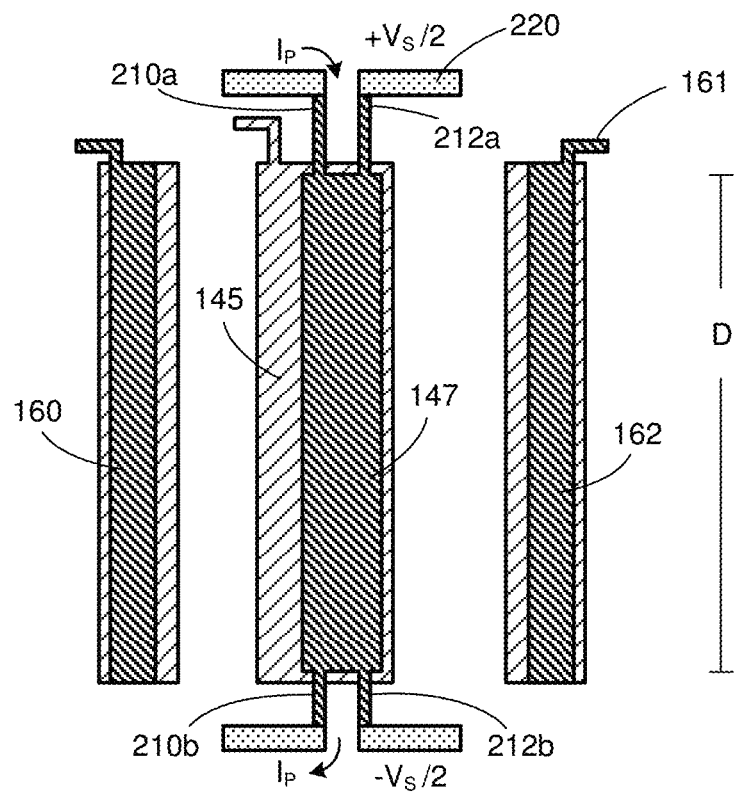
FIG. 2B depicts a plan view of gate, source, and drain structure for a HEMT that includes a floating gate plate, according to some embodiments.
Figure 2C:
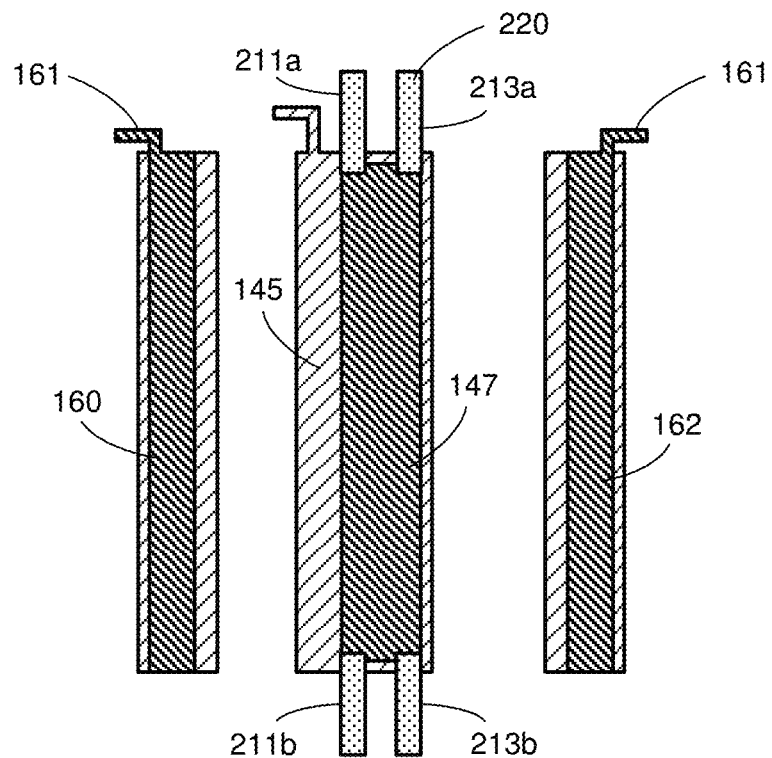
FIG. 2C depicts a plan view of gate, source, and drain structure for a HEMT that includes a floating gate plate, according to some embodiments.

Plan views of different embodiments of a floating gate plate 147 are illustrated in FIG. 2B and FIG. 2C. Other configurations of the floating gate plate 147 are also possible, and the invention is not limited to only the layout patterns shown. When FETs are formed in arrays, such as depicted in FIG. 1C, a floating gate plate 147 may be formed on each transistor, so that each transistor's temperature can be monitored independently. Alternatively, a floating gate plate 147 may be formed on one (e.g., one at or near the center of the array) or a few transistors distributed along an array to sample one or more representative temperatures in the array.

According to some embodiments, a floating gate plate 147 (or floating gate) may be configured for four-point probing, so that four-terminal Kelvin resistance measurements may be made, for example. In some cases, there may be two pairs of conductive contact tabs 210a, 210b, 212a, 212b providing electrical connection to the floating gate plate 147. The contacts in a pair of contact tabs may be spaced apart (e.g., located in distant or opposite end regions of the thermally-sensitive structure) according to some embodiments. In some implementations, the contact tabs of a pair may not be located at the ends of the floating gate plate, and may be located at different points along the floating gate plate 147. In preferred cases, at least two of the contact tabs (212a, 212b) are spaced apart on the floating gate plate 147 by a distance D that is large enough to measure changes in a voltage drop along the floating gate plate when a current is forced along the floating gate plate 147.

The contact tabs 210a, 210b, 212a, 212b may be electrically isolated from interconnects 161 that provide electrical connections to the gate metal 140, source contact 160, and drain contact 162. According to some embodiments, the contact tabs 210a, 210b, 212a, 212b may be formed from the same material as the floating gate plate 147 and patterned at the same time. In other embodiments, the contact tabs may be formed from a different material than the floating gate plate 147 and deposited in electrical contact with the floating gate plate during a separate processing step. In some cases, the contact tabs may be formed as conductive interconnects.

In some implementations, a gate plate 147 may not be floating, and instead be driven at one or more desired voltage values. Instead, the gate metal 140 and gate-connected field plate 145 (if present) may be floating. In such implementations, four-point probes may be connected to the floating gate metal 140 and/or floating gate-connected field plate 145, either or both of which may serve as thermally-sensitive structure in the transistor.

In operation and referring to FIG. 2B, a probe current $I_P$ may be applied through a first pair of contact tabs 210a, 210b on a thermally-sensitive structure. The applied current may be a DC current or an AC current. The probe current $I_P$ may be applied in a region of the floating gate plate 147 running adjacent to the gate metal 140 (not visible in FIG. 2B), which may lie under a gate-connected field plate 145 if the gate-connected field plate is present. While the probe current $I_P$ is applied, a voltage $V_S$ may be monitored across at least a portion of the region in which the current flows using a second pair of contact tabs (212a, 212b). From the measured voltage $V_S$ and known value of applied current $I_P$, a resistance value $R_S$ can be determined for the probed region of the thermally-sensitive structure. The amount of applied probe current may be between 200 microamps and 10 milliamps, according to some embodiments.

Many metals or materials that are used for gate metals, gate field plates (connected or coupled), source contacts, source field plates (connected or coupled), and drain contacts have a resistance that is temperature sensitive $R_S(T)$. Such metals or materials may be used for thermally-sensitive structure in a transistor, according to some embodiments. The temperature-dependent resistivity will be reflected in the measured voltage $V_S(T)$. Accordingly, monitoring the voltage $V_S(T)$ of a microscale thermally-sensitive structure within a FET can provide an indication of the operational temperature of the FET in a region near the gate and close to a highest temperature region of the device.

Materials that may be used for the floating gate plate 147 or other thermally-sensitive structures described herein are numerous. A single metal or material layer may be used in some cases, or multilayer metal stacks may be used in other cases. In some implementations, non-metal materials such as polysilicon may be used. Example metal stacks that may be used include, but are not limited to, Ni/Au, Ni/Au/Ti, Ti/Pt/Au, Ti/Au, Ti/Pt/Au/Ti, Ni/Pd/Au/Ti, Ni/Pt/Au/Ti, Ni/Ti/Al/W, Ni/W/Al/W, Ni/Ta/Al/Ta, Ni/Ta/Al/W, Ni/NiO/Al/W, Ni/NiO/Ta/Al/Ta, Ni/NiO/Ta/Al/W, W/Al/W, Ni/WN/Al/W, Ni/NiO/W/Al/W, Ni/NiO/WN/Al/W, WN/Al/W, Pt/Au/Ti, Ti/Pt/Au, Al/Cu, Ni/Cr, or TiN/Cu. Single metal layers may be formed from any one of the metals in these multilayer stacks.

In practice, a gate 140 metal may be driven at RF frequencies (e.g., frequencies over 500 MHz and as high as 7 GHz) for communications applications. Higher frequencies may be used in other embodiments. In high-frequency applications, it may be desirable to reduce adverse coupling of the RF signal to circuitry connected to the floating gate plate 147 or thermally-sensitive structure (circuitry not shown in FIG. 2B or FIG. 2C). According to some embodiments, coupling of the RF signal to thermally-sensitive structure and/or its circuitry may be reduced by adding a high-impedance elements 220 between the floating gate plate/thermally-sensitive structure and the connected circuitry. According to some embodiments, an inductance or resistance, or combination thereof, may be used as a high-impedance element, though a capacitor may be used alternatively or additionally in embodiments in which an applied probe current $I_P$ is an AC current.

In some implementations, a high-impedance element 220 (four shown in FIG. 2B) comprises a resistor, e.g., a thin-film resistor. A thin-film resistor may be formed from TaN, for example, polysilicon, or any other suitable material. A resistive high-impedance element 220 may have a resistance value between 300 ohms and 2000 ohms. According to some embodiments, the resistance value may be between 500 ohms and 1500 ohms. In some cases, thin-film resistors or high-impedance elements 220 may be formed on a same die as the transistor for which temperature sensing is implemented. In some cases, high-impedance elements may be formed on a separate die (packaged with the transistor, for example) or located on a circuit board (on which the transistor is mounted, for example) and electrically connect to contact tabs of the floating gate plate 147, for example. In some cases, a high-impedance element 220 may comprise a discrete resistor that can be mounted external to a packaged transistor that includes thermally-sensitive structure. The package may include pins for connecting resistors for the high-impedance elements 220. Thin-film resistive elements formed on a same die as the transistor may allow for a more compact assembly than having external discrete resistors. Alternatively, external resistors may allow for more design flexibility by a customer.

According to some implementations, contact tabs 211a, 211b, 213a, 213b may be formed from thin-film resistors, as depicted in FIG. 2C. The thin-film resistors may be deposited and patterned before or after the floating gate plate 147. The resulting contact tabs 211a, 211b, 213a, 213b may form ohmic contacts at one end to the floating gate plate 147, and connect, or provide connection points, at opposing ends to additional temperature-sensing circuitry.

Figure 3:
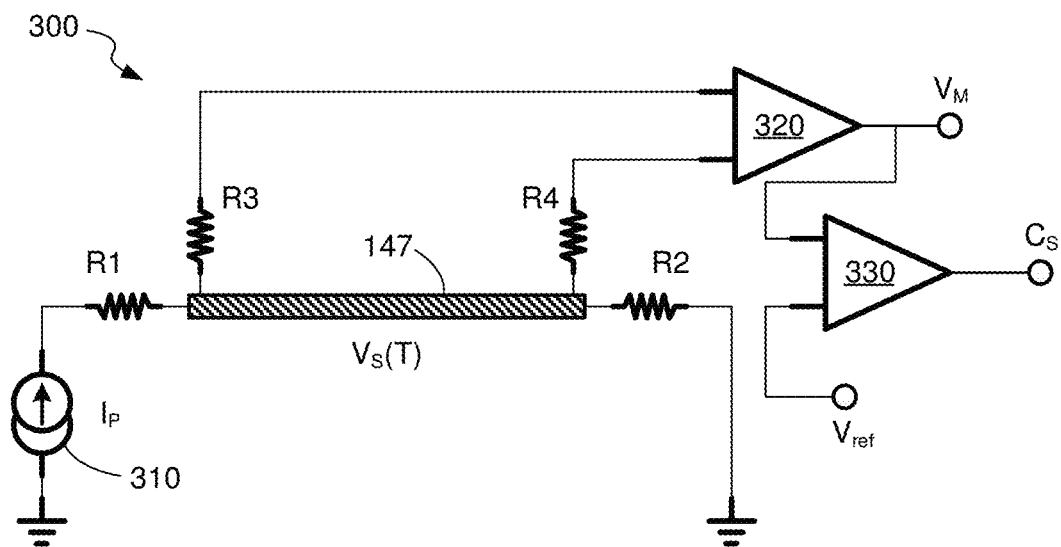
FIG. 3 depicts temperature-sensing circuitry that may be used with a floating gate plate, according to some embodiments.

One example of temperature-sensing circuitry 300 that includes a floating gate plate 147 formed on a transistor (not shown) is depicted in FIG. 3, according to some embodiments. Temperature-sensing circuitry 300 may comprise a source of current 310 and a differential amplifier 320, for example. Temperature-sensing circuitry may also include high-impedance elements 220 described above and shown in FIG. 3 as resistors R1-R4. In some implementations, the source of current 310 may comprise an integrated current source formed from one or more transistors, for example. The source of current 310 may be formed on a same die as the transistor and floating gate plate 147, or may be formed on a separate die in some cases. The source of current 310 may be configured to provide DC current, for the embodiment depicted in FIG. 3, or may be configured to provide AC current in other embodiments.

A differential amplifier 320 may comprise an integrated circuit having several transistors (e.g., two transistors in parallel circuit branches with their emitters or sources connected to a common current source). The differential amplifier may be configured to sense a difference in electric potential between two regions of the floating gate plate 147, as depicted in FIG. 3. According to some embodiments, the differential amplifier 320 may comprise operational amplifier circuitry that provides finite differential gain for voltage sensed between the two regions of the floating gate plate 147. The differential amplifier 320 may be formed on a same die as the transistor and floating gate plate 147, or may be formed on a separate die.

An output $V_M$ from the differential amplifier 320 may be used to monitor changes in a voltage drop across a region of the floating gate plate 147 during operation of the transistor. As described above, the monitored voltage $V_S(T)$ is temperature-dependent, and can provide an indication of the peak operating temperature of the transistor. In some implementations, the output voltage $V_M$ may be processed to estimate and/or track an operating temperature of the FET. For example, $V_M$ may be converted to a temperature value as described herein, and the temperature value may be output as digital data and/or visually displayed on test equipment. In some cases, FET temperature may be monitored during device testing to assess how well a FET may operate when placed in service and/or to estimate a MTTF of the FET when placed in service. In some implementations, FET temperature may be monitored during quality control procedures at a time of manufacture.

In other embodiments, the output voltage $V_M$ may be provided to a comparator 330 to determine whether or not a FET is operating within a predetermined temperature limit. For example, the output voltage $V_M$ may be compared against a preset reference voltage $V_{ref}$ to produce a control signal $C_S$. The control signal may be fed back to control operation of the transistor. For example, the control signal may be used to change transistor biasing, voltage supply values, and/or change a variable attenuator on an input RF signal, so that the operating power of the transistor is changed to reduce temperature or allow for a temperature increase. Other methods may be used to process $V_M$ and generate a control signal $C_S$ in other embodiments.

Figure 4:
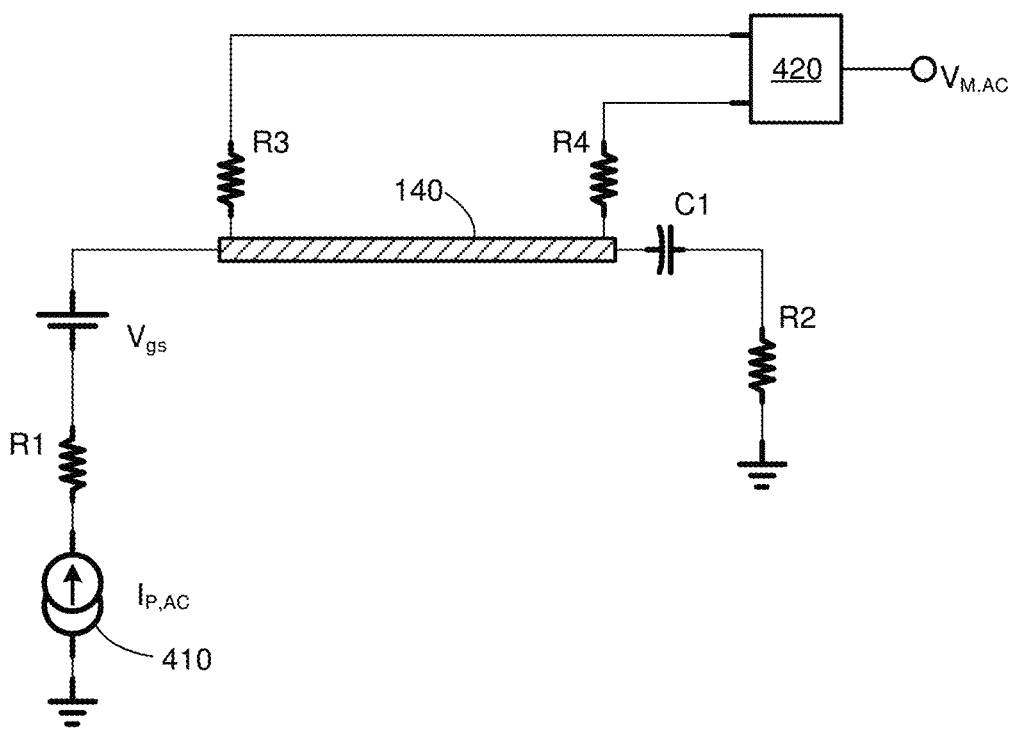
FIG. 4 depicts temperature-sensing circuitry that may use a transistor's gate, according to some embodiments.

Components other than a floating gate plate 147 may be used as a thermally-sensitive structure in a FET and other temperature-sensing circuits may be used in other embodiments. Further embodiments are depicted in FIG. 4-FIG. 6B. In some implementations, the gate metal or material 140 of a FET may be used to sense FET temperature, as depicted in FIG. 4. The inventors have recognized and appreciated that application of a DC current to the gate may adversely affect transistor bias, since it will introduce a gradient in bias along the gate. Accordingly, an AC probe current $I_{P,AC}$ from an AC current source 410 may be applied to the transistor's gate 140 in addition to the gate bias $V_{gs}$. An AC current source 410 may comprise an integrated oscillator and current amplifier, according to some embodiments. The AC current source 410 may be integrated on a same die as the transistor for which temperature sensing is implemented, or integrated on a separate die.

An RC shunt comprising a capacitor C1 and resistor R2 may connect to the gate 140 to provide a path for the AC probe current. The RC shunt may attach to the gate at a region that is remote from a location at which the current source 410 connects to the gate. To avoid interfering with the RF signal, the frequency of the probing AC current may be significantly less than a frequency of the RF signal. A characteristic frequency of the RF signal may be the frequency of a carrier wave used to transmit data in RF communications, for example, or may be the carrier frequency of a radar pulse for radar applications.

In some implementations, the frequency of the probing AC current may differ from the frequency of the RF signal by not less than a factor of 25. In some cases, the frequency of the probing AC current may differ from the frequency of the RF signal by not less than a factor of 10. Various probing AC frequencies may be used. For example, the frequency of the probe current $I_P$ may be approximately 1 MHz in some embodiments. In some cases, the probing AC frequency may be a value between 50 kHz and 5 MHz. Other embodiments may use a probing AC frequency having a value not less than 10 Hz. Other embodiments may use a probing AC frequency having a value up to 10's or hundreds of MHz. The RC shunt may comprise a low-pass filter that provides a path for the probe current but blocks high frequencies. In some implementations, the value of C1 and R2 may be selected to provide a cut-off frequency for the RC shunt that is approximately equal to or up to 20% higher than a frequency of the probe current $I_P$. When an AC probe current is used, AC voltage-sensing circuitry 420 may be employed. In some implementations, AC voltage-sensing circuitry may comprise an averaging peak-voltage detector. The AC voltage-sensing circuitry 420 may be integrated on a same die as the transistor for which temperature sensing is implemented, or integrated on a separate die.

In some embodiments (such as a testing facility), one or both of the source of current 310, 410 and voltage-sensing circuit 320, 420 may be embodied as a commercial instrument or stand-alone test equipment. In such cases, probes may be used to connect to contact tabs or connected probe pads (not shown) on a die containing one or more transistors under test. Such embodiments may be used when testing or qualifying devices at manufacture, for example, and allow a more compact transistor die.

Figure 5:
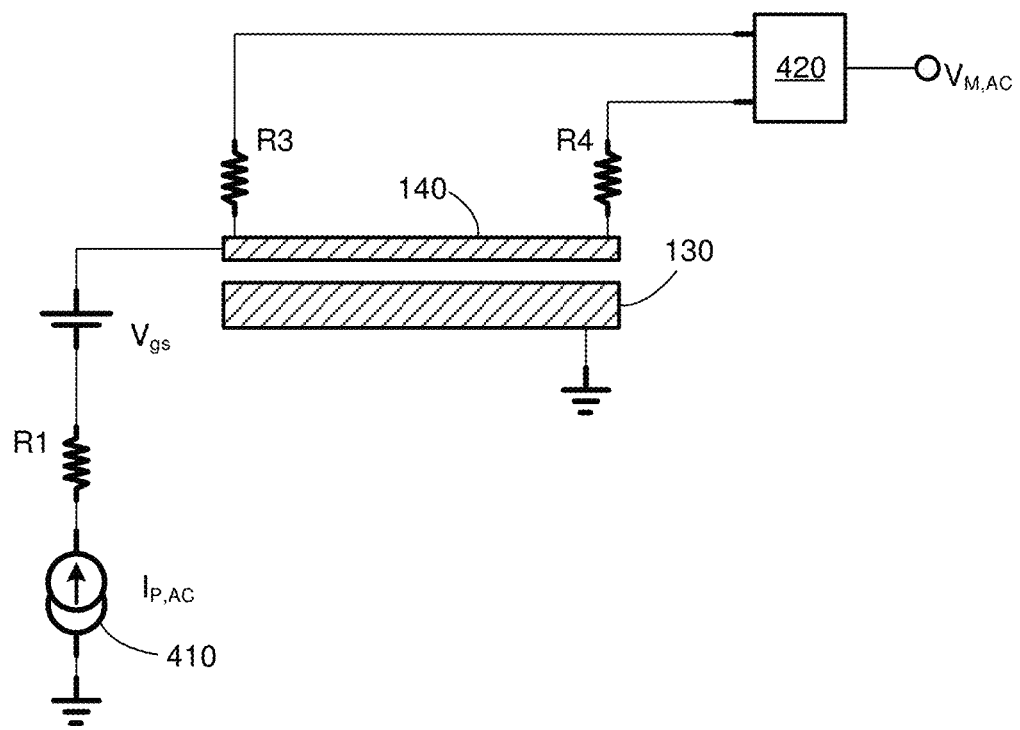
FIG. 5 depicts temperature-sensing circuitry that may use a transistor's gate, according to some embodiments.

FIG. 5 depicts another embodiment of temperature-sensing circuitry for a FET in which an AC probe current is applied to a gate metal 140 of the FET. In such embodiments, an RC shunt may not be used, and there may not be a contact tab at a distal end of the gate metal for the probe current to flow through. Instead, essentially all of the AC current $I_{P,AC}$ may couple to a source 130 (shown in this example) of the transistor, source contact 160, and/or source field plate through parasitic resistance and/or parasitic capacitance (not depicted in the drawing). The probe current frequency may be selected to increase or maximize flow of the probing AC current to the source, source contact, and/or source field plate. The embodiment depicted in FIG. 5 may result in a more compact transistor die or overall assembly than the embodiment shown in FIG. 4.

Figure 6A:
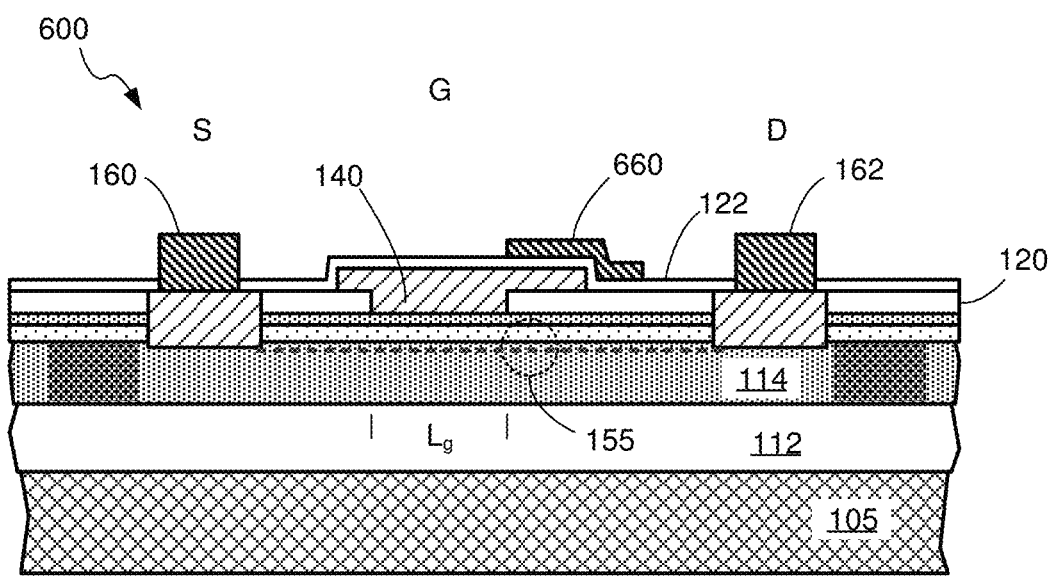
FIG. 6A is an elevation view of a HEMT having a source field plate that may be used for thermal sensing, according to some embodiments.
Figure 6B:
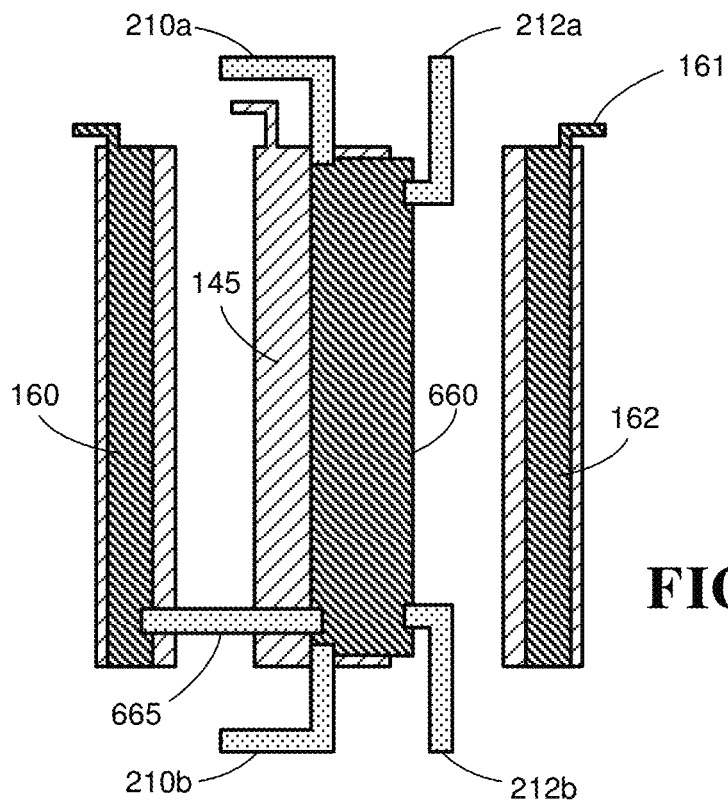
FIG. 6B depicts a plan view of gate, source, and drain structure for a HEMT that includes a source field plate, according to some embodiments.

FIG. 6A depicts an embodiment in which a source field plate 660 may be used as a thermally-sensitive structure for sensing temperature during operation of a FET. In this example, a HEMT is depicted though other types of FETs may be used. A plan view of the device is illustrated in FIG. 6B, according to one example. According to some embodiments, a source field plate 660 may be patterned to overlie at least a portion of the gate 140 and/or gate-connected field plate 145. The source field plate 660 may be insulated from the gate and/or gate-connected field plate by an insulating layer 122 and connected to the source contact 160 by a conductive interconnect 665. In some embodiments, the conductive interconnect 665, source contact 160, and source field plate 660 may be formed at a same time from a same layer of material (e.g., during a same deposition process). In some embodiments, the conductive interconnect 665 may comprise a thin-film resistor, as described above, that is patterned and deposited in a separate processing step from the source field plate. A resistive interconnect 665 may provide a slight DC potential to the source field plate, so that an AC probe current applied to the source field plate 660 rides above a ground voltage, for example.

The conductive interconnect 665 may be located near or at an end of the source field plate, in some cases, so that an applied probe current flows over a majority of the length of the source field plate 660, rather than being shunted near the middle of the source field plate. In some embodiments, a contact tab (e.g., tab 210b in FIG. 6B) may be omitted, and the applied probe current may flow along a majority of the length of the source field plate 660 via the conductive interconnect 665 to a reference potential that is connected to the transistor's source contact 160. In some cases, the conductive interconnect 665 may comprise a thin-film resistor, as described above, that reduces RF coupling to the source contact 160.

Figure 6C:
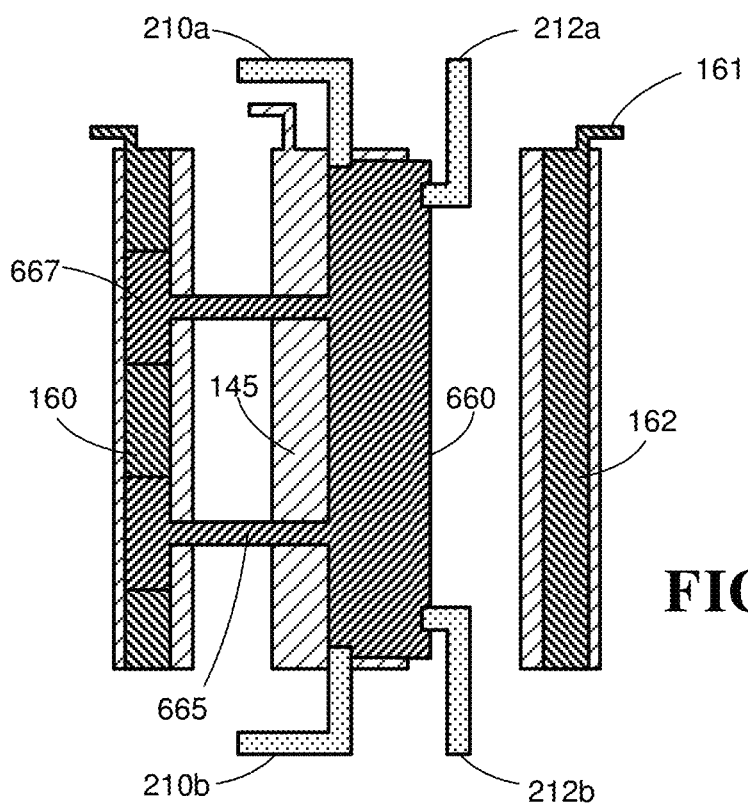
FIG. 6C depicts a plan view of gate, source, and drain structure for a HEMT that includes a floating source field plate, according to some embodiments.

According to some implementations, a source field plate 660 may be electrically floating. For example, there may not be a direct-current path between the source field plate 660 and the source contact 160. In some cases, there may be one or more capacitive couplers 667 that capacitively couple the source field plate 660 to the source contact 160, as depicted in FIG. 6C. The capacitive couplers 667 may be formed from a conductive film that is separated from the source contact 160 by an insulating layer, e.g., an oxide layer or other dielectric. To improve thermal-sensing accuracy of the transistor's hot spot 155 (depicted in FIG. 6A) by the floating source field plate, there may be narrow conductive interconnects 665 connecting the capacitive couplers 667 to the source field plate 660.

In other embodiments, a source field plate 660 may extend all the way to and overlay the source contact 160 to provide capacitive coupling to the source contact. In such embodiments, separate capacitive couplers 667 may not be present. Instead the source field plate 660 may appear as a single rectangular-shaped conductive film that overlays at least a portion of the source contact 160 and at least a portion of the gate 140 and/or gate-connected field plate 145.

There can be several benefits to using a source field plate 660 for thermal sensing of a FET rather than a gate 140 or gate-connected field plate 145. A first benefit is that a source field plate 660 may have a portion located near the FET's hottest region 155. In some implementations, the source field plate 660 may be limited in shape to a region near the transistor's hot spot, as depicted in FIG. 6A. For example, the source field plate 660 may be limited to a region that overlaps none or a portion of the gate metal 140 and extends no more than one-quarter of the distance to the drain contact 162 from the gate. An additional benefit is that the source field plate 660 can be electrically connected to the source with RF/DC isolation, resulting in little or no perturbation to transistor performance. Such perturbation might otherwise occur when current and voltages for sensing temperature are imposed on the transistor's gate metal 140 or gate-connected field plate 145.

Another benefit, for certain FET types, of using a source field plate 660 for temperature sensing is that problems associated with leakage of the probe current applied to the transistor's gate may be avoided. In some FETs, a probe current applied to the transistor's gate metal may leak to alternate current paths (to the transistor's source, for example). Such leaking may be temperature dependent and result in an inaccurate evaluation of device temperature over a range of temperatures. In contrast, a source field plate 660 may have better isolation than a gate and can reduce leakage of probe current $I_P$ during temperature sensing.

Although use of a source field plate may be preferred in some cases, some implementations may use a gate metal 140 and/or gate-connected field plate 145 for thermal sensing. In yet other embodiments, independent temperature sensing circuits in a same transistor may use both a gate metal or gate field plate and a source field plate. Two temperature-sensing circuits with two thermally-sensitive structures may be employed for redundancy and/or measurement confirmation. In some implementations, two temperature-sensing circuits may be used to evaluate a thermal gradient in a FET and to better estimate a peak temperature of the device based on the thermal gradient.

There is also a benefit to using the thermally-sensitive structures described above. For example, existing FET structure and materials (with only slight modification) may be used to sense FET temperature. Additionally, the thermally-sensitive structure may be microscale and located adjacent to the FET's hot spot 155, so that an improved, localized estimate of the FET's peak temperature can be obtained. In some implementations, the thermally-sensitive structure may have a length, in the direction of the gate length, that is any value between 0.2 microns and 5 microns. A width of the thermally-sensitive structure may be approximately equal to a width of the FET's gate and may be between 1 micron and 1 millimeter. A thickness of a thermally-sensitive structure may be between 50 nanometers and 2 microns. Other sizes may be used for a thermally-sensitive structure in other embodiments.

According to some embodiments, the temperature sensitivity of a thermally-sensitive structure (gate metal, gate-connected field plate, source field plate) in a FET may be calibrated using one or more FETs on a die or wafer. For example, a die or wafer may be placed on a thermal plate and heated over a range of temperatures while the FET's source, gate, and drain contacts are left floating. The wafer or die may be allowed to reach thermal equilibrium at each temperature before resistance measurements are made. The resistance measurements may comprise applying a probe current $I_P$ and sensing a voltage drop $V_S(T)$ across a region of the thermally-sensitive structure in which the probe current flows. Results for such a calibration may appear as shown in FIG. 7.

Figure 7:
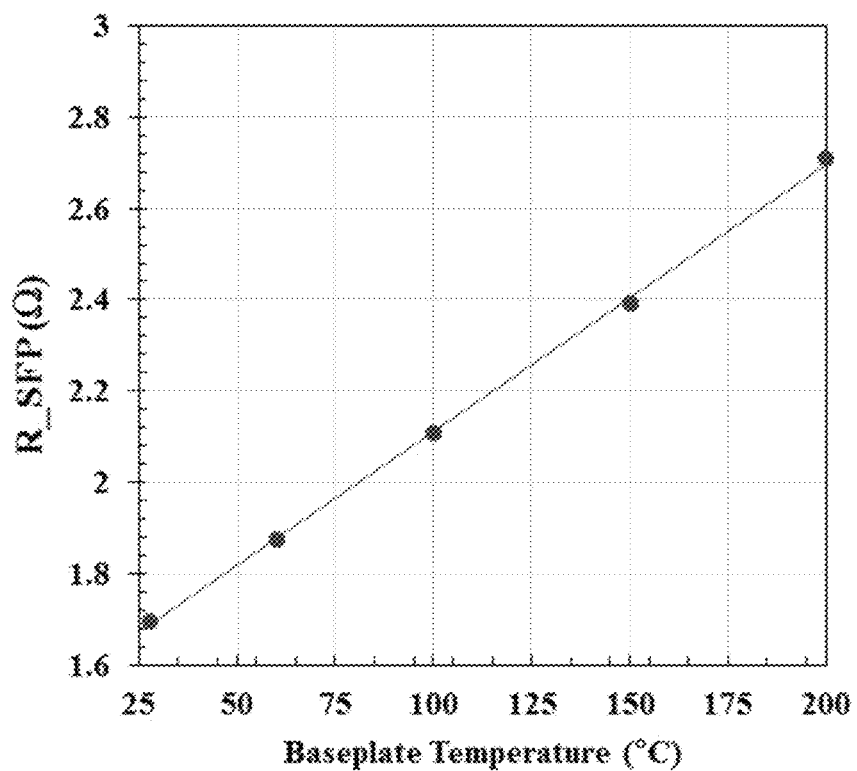
FIG. 7 plots measured resistance of a source field plate as a function of baseplate temperature, according to some embodiments.

The data for FIG. 7 was obtained for an example HEMT device using a metal source field plate as the thermally-sensitive structure. The graph shows resistance values (calculated from the applied current and measured voltage drops) plotted as a function of baseplate temperature. In this example device, the change in resistance of the thermally-sensitive structure with respect to change in temperature of the structure is about 0.006 ohm/° C. Other embodiments with different materials may have different thermal sensitivity. In some cases, the thermal sensitivity may be between 0.001 ohm/° C. and 0.05 ohm/° C. In other cases the thermal sensitivity of the thermally-sensitive structure may have a lower or higher value than this range.

The graph of FIG. 7 may be used to evaluate temperatures of identical FET devices (or similar FET devices that include identical thermally-sensitive structures) that are probed during device operation. As an example, a calibration equation (e.g., an equation for a line that fits the data in points in FIG. 7) or look-up table may be determined from the measured data and used to convert subsequently-measured resistance values to temperatures.

Although resistance is plotted in FIG. 7, other embodiments may use other values. In some cases, voltage may not be converted to resistance. Instead, measured voltage may be plotted as a function of baseplate temperature and voltage values may be used directly to evaluate temperatures of identical FET devices that are probed during device operation. In other cases, sheet resistance (Ohm/square) may be determined for the thermally-sensitive structure and plotted as a function of temperature, so that the results may be used to evaluate temperatures in FETs having a thermally-sensitive structure of a different shape and/or size, though having a same sheet resistance.

Figure 8:
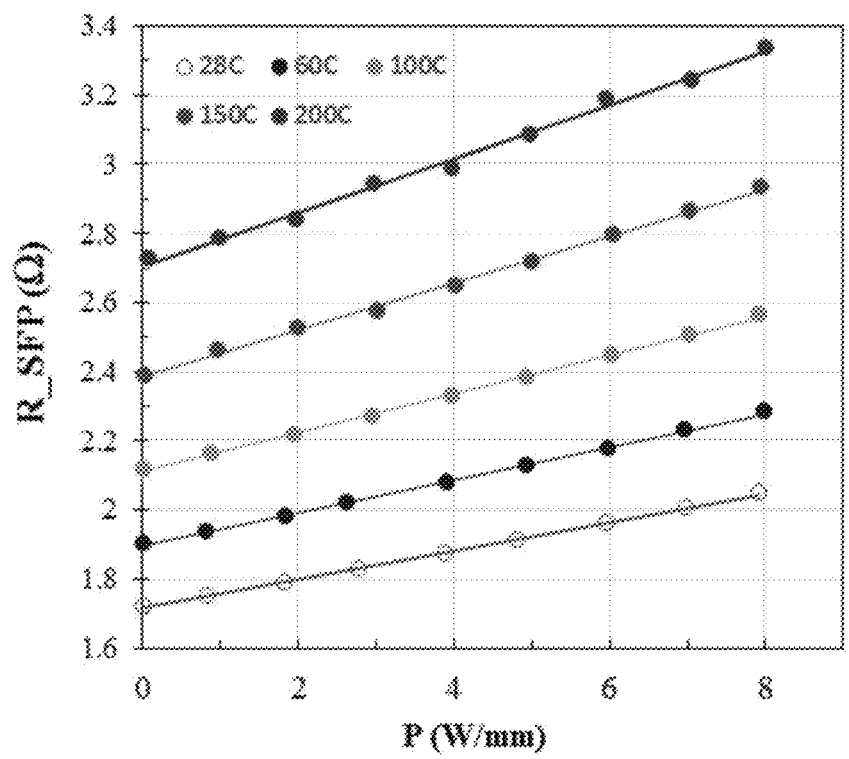
FIG. 8 plots measured resistance of a source field plate as a function of amplifier operating power for different baseplate temperatures, according to some embodiments.
Figure 9:
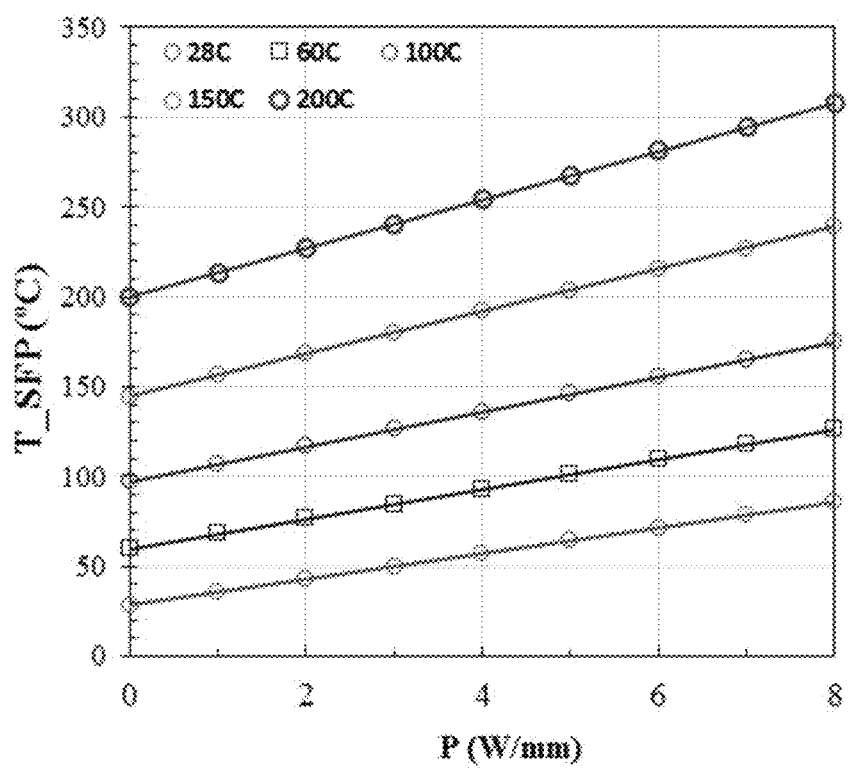
FIG. 9 plots inferred temperatures of a source field plate as a function of amplifier operating power at different baseplate temperatures based on the results of FIG. 8, according to some embodiments.

An example of using calibration values, such as those obtained for the example of FIG. 7, is described further in connection with FIG. 8 and FIG. 9. To produce the graph of FIG. 8, a HEMT was operated at different power levels (from 0 to approximately 8 W/mm) while a baseplate supporting the HEMT was sequentially set at five different temperatures. The plotted resistance values for each measurement shown in FIG. 8 were determined from measured voltage drops $V_S(T)$ across a region of the source field plate and the applied probe current $I_P$.

After finding the resistance values (plotted in FIG. 8) under the different operating conditions, the calibration values of FIG. 7 (or a resulting calibration equation or look-up table) may be used to convert the measured resistances of FIG. 8 to temperature values. The corresponding temperature values are plotted in FIG. 9, as an example of data conversion using the calibration data.

Figure 10:
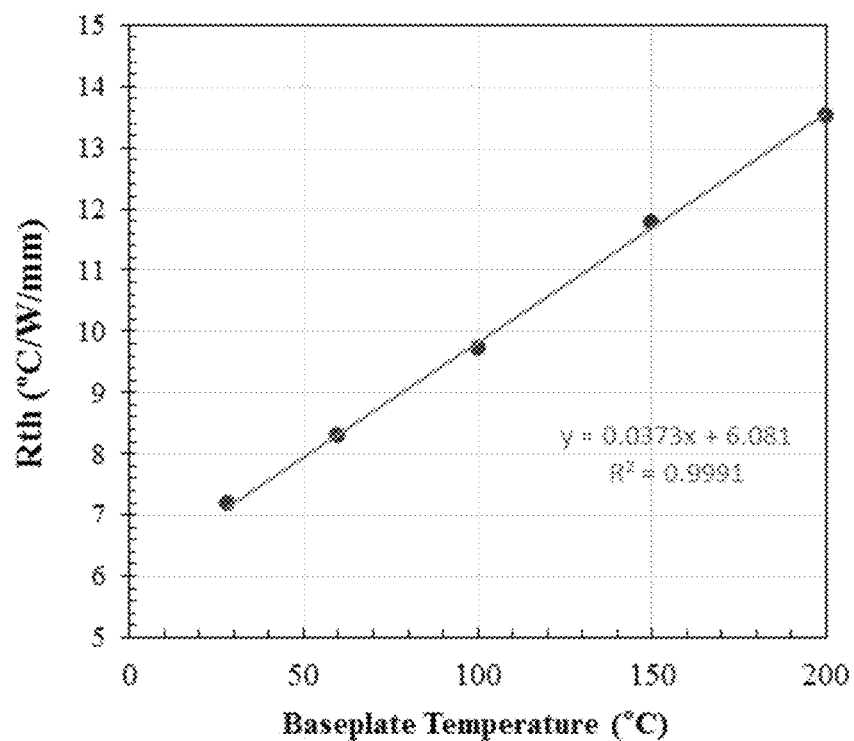
FIG. 10 plots calculated thermal resistance of a source field plate as a function of baseplate temperature based on the results of FIG. 9, according to some embodiments.

The slope of each line in FIG. 9 represents the thermal resistance of the thermally-sensitive structure (source field plate) at a different baseplate operating temperature. Thermal resistance for the example device is plotted as a function of temperature in FIG. 10.

In a packaged power transistor, a thermal sink (e.g., thermally-conductive plate) may be included to improve thermal conduction of heat away from the transistor. In some cases, there may be more than one thermal sink. A thermal sink may be included in a power transistor package, in some cases. In some embodiments, there may be additionally or alternatively a thermal sink external to the power transistor package to which the transistor package may be mounted. Some implementations may include a temperature sensor (e.g., a thermistor) on a thermal sink, so that a temperature of the thermal sink can be monitored during operation of the power transistor. Accordingly, data like that shown in FIG. 8 and FIG. 9 may be used to estimate operating temperature of a power transistor using a measured resistance value and a measured temperature of a thermal sink that is in thermal contact with the power transistor.

It will be appreciated that the values plotted in FIG. 7-FIG. 10 are for an example device and for explanation purposes only. Different values and calibration curves may be obtained for devices different from the sample device. The invention is not limited to the values and calibration data shown in these figures.

Methods of operating FETs in accordance with the present embodiments provide techniques for sensing and evaluating operating temperatures of FETs. In some cases, values of sensed temperatures may be used for feedback control of a FET. According to some embodiments, a method of operating a field-effect transistor may comprise acts of applying a signal to a gate of the field-effect transistor, amplifying the signal with the FET, and applying a probe current in a region of a thermally-sensitive structure (e.g., a source field plate) of the FET. The source field plate may be coupled to a source contact of the FET. A method may further comprise sensing a voltage produced by the applied probe current. In some cases, the probe current may be applied to a gate, floating gate, gate field plate, or floating gate plate of a FET. In other cases, the probe current may be applied to at least two components from among the FET's gate, floating, gate field plate, floating gate plate, and source field plate.

A method of operating a FET may include evaluating, from the sensed voltage, a temperature of the field-effect transistor that is representative of a localized peak temperature near the gate of the transistor. The evaluation of temperature may comprise using calibration results for the field-effect transistor's thermally-sensitive structure. In some embodiments, sensed voltages may not be converted to temperature. Instead, the sensed voltages may be used as indicators of FET temperature. For example, in some implementations, a method of operating a FET may comprise acts of comparing a sensed voltage to a reference value. In some cases, a power level of the field-effect transistor may be controlled based upon the comparison.

In some aspects of temperature sensing, a method may comprise applying the probe current along a region of a thermally-sensitive structure (e.g., source field plate or floating gate plate) that overlays at least a portion of the FET's gate. In some cases, applying the probe current comprises applying an alternating current in the region. For some embodiments, applying the alternating current may comprise applying the alternating current at a first frequency that is different from a characteristic frequency amplified by the field-effect transistor by not less than a factor of 25.

In some implementations, applying the probe current may comprise intermittently applying the current in the region, such that the current is driven for intervals of time that are spaced apart by other intervals of time in which no probe current is applied in the region of the thermally-sensitive structure. Intermittent applying of probe current may reduce power consumption and interference with FET operation. According to some embodiments, the probe current may be applied only at times during and/or immediately after an input signal rises above a predetermined power or voltage level. For example, a comparator may be connected to sense an input level applied to a gate 140 of a FET, and activate a current source 310, 410 in response to the input level exceeding or falling below a reference value. In this manner, temperature sensing may be executed only during and/or immediately after the transistor handles large input signals (e.g., during and/or after peak power intervals).

Methods of operating FETs that include temperature sensing may further include acts of amplifying signals (for communication systems, medical imaging equipment, or microwave applications, for example) or switching voltages and/or currents (for power conversion applications, power generation, snubber circuits, or overvoltage/overcurrent protection, for example). In power applications, a FET with thermal sensing may be used in power amplifiers (such as Doherty amplifiers) that amplify signals to power levels of not less than 0.25 Watts. In some implementations, thermal sensing may be used in power amplifiers that amplify signals to power levels in a range of not less than 0.5 Watts and as high as 150 Watts. It will be appreciated that FETs with temperature sensing may be used for various different FET applications, and that temperature sensing techniques that use existing gate and/or source structures, as described herein, can have little or no impact on normal operation of the FET.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A field-effect transistor with temperature sensing comprising:
    a gate;
    a floating gate plate adjacent to the gate and having an extended length;
    a source contact;
    a drain contact;
    a first pair of contact tabs connected to the floating gate plate and separated by a first distance for applying a probe current through the floating gate plate; and
    a second pair of contact tabs connected to the floating gate plate and separated by a second distance for sensing a voltage across a region of the floating gate plate through which the probe current flows.

2. The field-effect transistor of claim 1, wherein the floating gate plate overlays at least a portion of the gate.

3. The field-effect transistor of claim 1, wherein the floating gate plate exhibits a change in resistance with a change in temperature of the floating gate plate that is not less than 0.001 ohms/° C.

4. The field-effect transistor of claim 1, wherein the first pair of contact tabs comprises a first thin-film resistor and a second thin-film resistor.

5. The field-effect transistor of claim 4, wherein a resistance of the first thin-film resistor and of the second thin-film resistor is not less than 300 ohms.

6. The field-effect transistor of claim 4, wherein the second pair of contact tabs comprises a third thin-film resistor and a fourth thin-film resistor.

7. The field-effect transistor of claim 6, wherein a resistance of the third thin-film resistor and of the fourth thin-film resistor is not less than 300 ohms.

8. The field-effect transistor of claim 1, further comprising a source of the probe current connected to the first pair of contact tabs.

9. The field-effect transistor of claim 8, wherein the source of the probe current is configured to provide alternating current.

10. The field-effect transistor of claim 8, wherein the alternating current has a frequency between 50 kilohertz and 5 megahertz.

11. The field-effect transistor of claim 1, further comprising voltage-sensing circuitry connected to the second pair of contact tabs.

12. The field-effect transistor of claim 11, wherein the voltage-sensing circuit provides an output signal to a feedback circuit that controls a power level of the field-effect transistor.

13. The field-effect transistor of claim 1, wherein the field-effect transistor is incorporated in a power amplifier configured to amplify signals to a power level of not less than 0.25 Watt.

14. The field-effect transistor of claim 1, further comprising an active area controlled by the gate, wherein the active area comprises GaN, GaAs, or InP.

15. The field-effect transistor of claim 1, further comprising an active area controlled by the gate, wherein the active area comprises Si.

16. The field-effect transistor of claim 1, wherein the field-effect transistor is an LDMOS FET, MOSFET, MISFET, or MODFET.

17. The field-effect transistor of claim 1, wherein the field-effect transistor is an HEMT, HFET, or pHEMT.

18. A field-effect transistor with temperature sensing comprising:
- a gate metal having an extended length with a first end and an opposing second end;
- a source contact;
- a drain contact;
- a first contact tab connected to the gate metal near the first end for applying an alternating probe current to the gate metal;
- a capacitor and resistor connected in series between a reference potential and an end region of the gate metal that is remote from the first end; and
- a pair of contact tabs connected to separated regions of the gate metal for sensing a voltage drop along the gate metal in response to the alternating probe current.

19. The field-effect transistor of claim 18, further comprising a source of the probe current connected to the first contact tab.

20. The field-effect transistor of claim 19, wherein the alternating probe current has a frequency between 50 kilohertz and 5 megahertz.

21. The field-effect transistor of claim 18, further comprising voltage-sensing circuitry connected to the pair of contact tabs.

22. The field-effect transistor of claim 21, wherein the voltage-sensing circuit provides an output signal to a feedback circuit that controls a power level of the field-effect transistor.

23. The field-effect transistor of claim 18, wherein the field-effect transistor is incorporated in a power amplifier configured to amplify signals to a power level of not less than 0.25 Watt.

24. The field-effect transistor of claim 18, further comprising an active area controlled by the gate metal, wherein the active area comprises GaN, GaAs, or InP.

25. The field-effect transistor of claim 18, further comprising an active area controlled by the gate metal, wherein the active area comprises Si.

26. The field-effect transistor of claim 18, wherein the field-effect transistor is an LDMOS FET, MOSFET, MISFET, or MODFET.

27. The field-effect transistor of claim 18, wherein the field-effect transistor is an HEMT, HFET, or pHEMT.

28. A field-effect transistor with temperature sensing comprising:
- a gate metal having an extended length with a first end and a second end;
- a source;
- a drain; and
- a first contact tab connected to a first end region of the gate metal near the first end and configured for applying an alternating probe current to the gate metal, wherein no other contact tab is connected to the gate metal for conducting the probe current and wherein essentially all of the probe current, when applied, couples to a source of the field-effect transistor.

29. The field-effect transistor of claim 28, further comprising a pair of contact tabs connected to separated regions of the gate metal for sensing a voltage drop along the gate metal in response to the alternating probe current.

30. The field-effect transistor of claim 29, further comprising voltage-sensing circuitry connected to the pair of contact tabs.

31. The field-effect transistor of claim 28, wherein the alternating probe current has a frequency between 50 kilohertz and 5 megahertz.

32. The field-effect transistor of claim 28, wherein the field-effect transistor is incorporated in a power amplifier configured to amplify signals to a power level of not less than 0.25 Watt.

33. The field-effect transistor of claim 28, further comprising an active area controlled by the gate metal, wherein the active area comprises GaN, GaAs, or InP.

34. The field-effect transistor of claim 28, further comprising an active area controlled by the gate metal, wherein the active area comprises Si.

35. The field-effect transistor of claim 28, wherein the field-effect transistor is an LDMOS FET, MOSFET, MISFET, or MODFET.

36. The field-effect transistor of claim 28, wherein the field-effect transistor is an HEMT, HFET, or pHEMT.

* * * * *